United States Patent [19]

Maeda

[11] Patent Number: 5,512,747
[45] Date of Patent: Apr. 30, 1996

[54] AUTO FOCUSING APPARATUS OF SCANNING ELECTRON MICROSCOPES

[75] Inventor: Tatsuya Maeda, Hitachinaka, Japan

[73] Assignee: Hitachi, Ltd., Tokyo, Japan

[21] Appl. No.: 355,927

[22] Filed: Dec. 14, 1994

[30] Foreign Application Priority Data

Dec. 21, 1993 [JP] Japan .................... 5-322396

[51] Int. Cl.$^6$ .................... H01J 37/21
[52] U.S. Cl. .................... 250/310; 250/396 R; 250/397
[58] Field of Search .................... 250/310, 307, 250/311, 396 R, 397, 396 ML, 306

[56] References Cited

U.S. PATENT DOCUMENTS

| | | | |
|---|---|---|---|
| 4,514,634 | 4/1985 | Lawson | 250/310 |
| 4,724,319 | 2/1988 | Shirota | 250/307 |
| 5,032,725 | 7/1991 | Kanda | 250/310 |
| 5,198,668 | 3/1993 | Yamada | 250/310 |
| 5,313,062 | 5/1994 | Yamada | 250/310 |
| 5,393,977 | 2/1995 | Okura et al. | 250/307 |
| 5,404,012 | 4/1995 | Yamada | 250/310 |

*Primary Examiner*—Jack I. Berman
*Assistant Examiner*—Kiet T. Nguyen
*Attorney, Agent, or Firm*—Kenyon & Kenyon

[57] ABSTRACT

An auto focusing apparatus of a scanning electron microscope includes an auto focusing mechanism which calculates a focus evaluation value, using an electron signal or picture signal generated from a specimen when the specimen is scanned by an electron beam focused by an objective lens, and controls an exciting current of the objective lens according to said focus evaluation value. A focus correction value register and a focus correction mechanism for correcting the focused position determined by the aforementioned auto focusing mechanism by as much as the correction value registered in the focus correction value register are provided.

8 Claims, 5 Drawing Sheets

PRIOR ART

AUTO FOCUSING APPARATUS OF SCANNING ELECTRON MICROSCOPES

BACKGROUND OF THE INVENTION

This invention relates to an auto focusing apparatus of a scanning electron microscope.

In a scanning electron microscope, as shown in FIG. 1, an electron beam generated from an electron gun (not shown) is scanned by deflection coils 2X and 2Y and focused into a narrow beam, which in turn is irradiated onto a specimen 4. Secondary electron 14 generated from the specimen 4 is detected by a detector 5. By using an electron signal amplified by an amplifier 6 as a brilliance modulation signal for a monitor (not shown) and by synchronizing the signal with scanning by the deflection coils 2X and 2Y, the brilliance modulation is complete and a scanning electron microscopic image of the specimen 4 is obtained on the monitor screen. Stage 15 can receive coordinates data of a measuring point from a wafer information file stored in an external storage device, in which the coordinates of points to be measure are registered, and move the wafer to a required measuring point. Data is registered in the wafer information file for each production process of wafers such as a gate creation or contact hole creation process or for each type of wafer, such as 1M-bit memory or 4M-bit memory wafers, and the file is loaded by an operator from the external storage device before measuring each wafer.

In the meantime, because the absolute value of time differential (or position differential) of the electron signal detected by the detector 5 becomes larger as the electron beam 1 is focused on the specimen 4 more accurately, it can be used as an index for evaluating the focused condition. An area within the dotted line in FIG. 1 shows an example of a conventional focused position detector 10 which employs this index. For performing focusing, as the exciting current of the objective lens (electro-magnetic lens) 3 is changed sequentially and gradually by a focus controller 7, each exciting current makes the electron beam 1 scan on the specimen 4. Then, the intensity of the secondary electron signal obtained at each excitation is integrated and the absolute value of the signal for a certain scanning period is differentiated, both by a signal intensity integrator 8. As a result of the above calculation, a value corresponding to each focused condition is obtained as an output from the signal intensity integrator, which is now called a focus evaluation value. In an understanding that the beam is exactly focused when the focus evaluation value obtained under each excitation of the objective lens reaches its peak, a peak detector 9 detects the peak of the focus evaluation value, and an exciting current that makes the focus evaluation value become the peak is sent to the objective lens 3 from a focus controller 7, thereby performing focusing.

Next, a brief explanation is given, using FIG. 2, about a conventional auto focusing method that employs a picture processing technique. In FIG. 2, the same functional parts as in FIG. 1 are given with the same numbers and a detailed description on them is omitted. Using the secondary electron signal from the amplifier 6 as a brilliance modulation signal of the monitor 11, which is scanned in synchronization with the deflection coils 2X and 2Y, a scanning electron microscopic picture of the specimen 4 is displayed on the monitor 11. Because the contrast of the picture becomes more intense as the electron beam 1 is focused on the specimen 4 more exactly, the picture signal serves as an index for evaluating the focus when the signals of adjacent picture elements are integrated or differentiated and the sum of their absolute values is calculated. Here, the sum is called a focus evaluation value. An area within the dotted line in FIG. 2 shows an example of a focused position detector 10 which employs this focus evaluation value. The function of the focused position detector 10 is the same as in FIG. 1 except that a picture processor 8 receives the picture signal from the monitor 11 and calculates the focus evaluation value while the signal intensity integrator 8 calculates the value in FIG. 1. Similarly as in FIG. 1, the peak detector 9 detects the peak of the focus evaluation value and an exciting current that makes the focus evaluation value become the peak is sent to the objective lens 3 from the focus controller 7, thereby performing focusing.

While determining the current of the objective lens in auto focusing in the aforementioned prior art, because the focus evaluation value depends on the integrated value of the secondary electron signal intensity due to the principle of its operation, the focus is directed to a point where the intensity of the signals detected in the scanning area changes the most. Because the signal intensity exhibits higher contrast particularly at an edge along the height of the specimen, an unstable peak of the focus evaluation value may appear when the current of the objective lens is changed gradually or a focus is determined at a height of the specimen where particularly intense contrast is resulted if differences in height are included in the scanning area of the specimen. As a result, the point determined by the auto focusing is sometimes different from the point the operator really wants to observe.

In a mass production factory for semiconductor wafers, a scanning electron microscope designed for semiconductor wafers is employed to control pattern dimensions of the wafers after specific production processes. In this application, a point where the dimensions need to be controlled is predetermined and the dimensions of the specific point is always measured on every mass-produced wafer for quality control. Although patterns to be controlled include the line width and the hole pattern diameter, later production processes involve more complicated differences in height on a wafer. Further, in measuring the inside diameter of a bottom of the hole pattern or measuring the dimension of a bottom of a line pattern, the signal from the edge is more intense while that the signal from the bottom is less intense. Thus, an auto focusing mechanism frequently directs the focus to a height which the operator does not intend to measure. When this mislocation of the focus occurs, it is necessary to correct the focus manually for all wafers after execution of auto focusing operation because the measurement of the pattern dimensions of the wafers are always done on the same point. Manually correcting the focus is very inconvenient. If all of the control processes are to be carried out automatically, and if the mislocation of focus occurs then the measurement is done on an incorrectly focused point and accordingly the obtained data is less reliable, which is a serious quality control problem.

SUMMARY OF THE INVENTION

This invention corrects the aforementioned problem as follows. The focused position incorrectly determined to be a real focus by the focus detector is corrected by an operator by as much as a correction value for each specific purpose, which has already been registered by the operator in the focus correction value register, and the focus of the electron beam is determined by the focus controller, wherein an applicable correction value is automatically set using the data in the wafer information file.

In short, this invention covers an auto focusing apparatus of a scanning electron microscope including an auto focusing mechanism which calculates a focus evaluation value, using an electron signal or picture signal generated from a specimen when the specimen is scanned by an electron beam focused by an objective lens, and controls an exciting current of the objective lens according to said focus evaluation value. The scanning electron microscope also includes a focus correction value register and a focus correction mechanism which corrects the focused position determined by the aforementioned auto focusing mechanism by as much as the correction value registered in the focus correction value register are provided.

The focused position can be corrected by correcting the exciting current through the objective lens.

Multiple correction values in combination with the position information of an observation point can be registered in the focus correction value register.

Multiple correction values can be registered in the focus correction value register according to type or production process of the specimen, and can be set selectively according to the specimen to be observed.

By registering the focus correction values before operation, it becomes possible to move the focused position determined by an auto focusing algorithm to a position required by the operator and adjust the focus to the point during the auto focusing operation.

DETAILED DESCRIPTION

Figure 1:
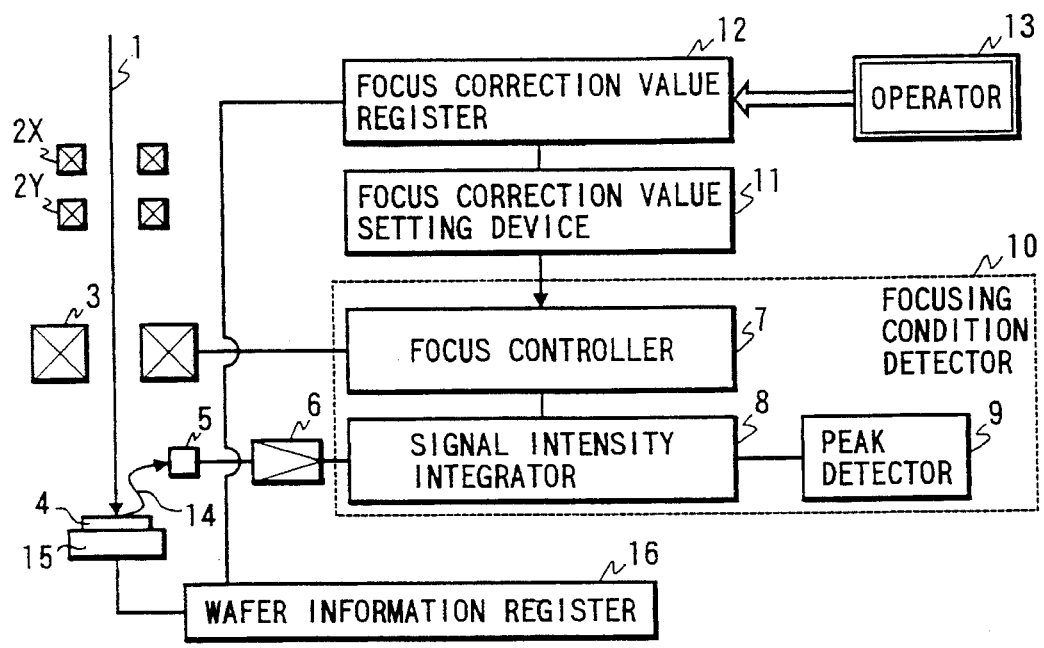
FIG. 1 is a brief diagram of an embodiment of this invention showing a scanning electron microscope equipped with an auto focus correction apparatus.

An embodiment of this invention applied to an electron microscope for observing semiconductor wafers is given hereunder using FIG. 1. In this embodiment, it is assumed as described before that the semiconductor wafers are mass-produced and the observation is always done on the same point and the area around the observed point have similar patterns.

Figure 2:
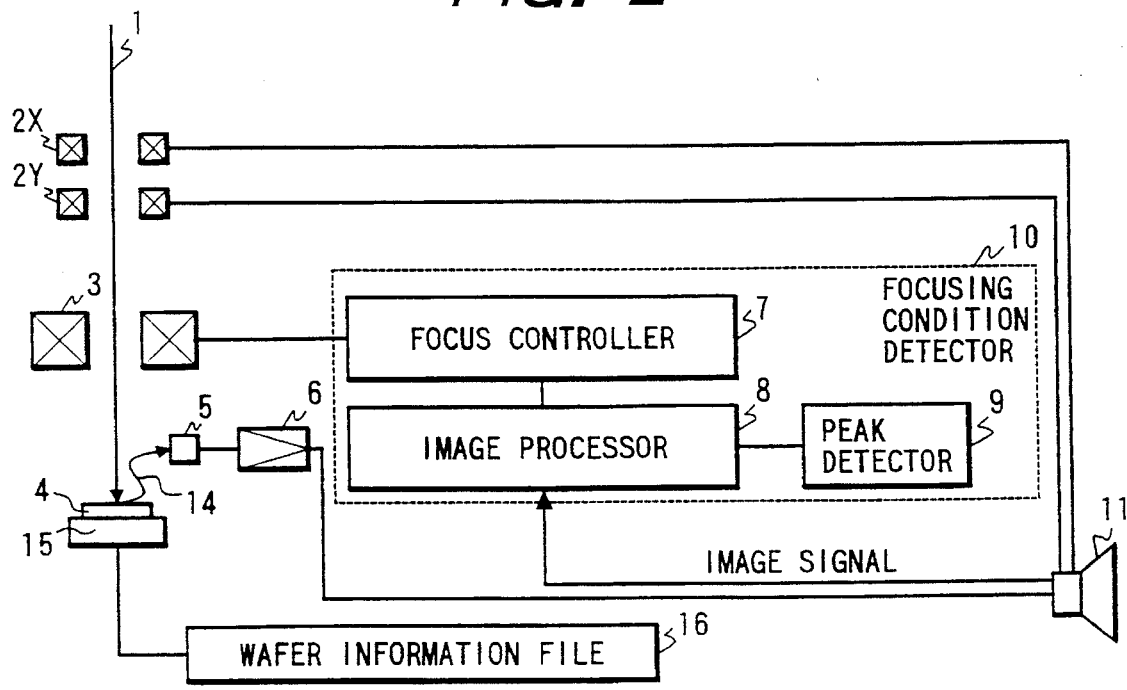
FIG. 2 is a brief diagram of a conventional auto focusing mechanism based on picture processing.

As shown in FIG. 1, in a conventional auto focusing apparatus 10, an electron beam 1 generated from an electron gun (not shown) is focused into narrower beam by the objective lens 3, which in turn is irradiated onto the specimen 4. The stage 15 on which the specimen is placed receives coordinated data of a measuring point from the wafer information file 16, in which the coordinates of the points to be measure are registered, and moves the wafer to a required measuring point. Data is registered in the wafer information file for each type of wafer and the file is loaded by an operator from the external storage device before measuring each wafer. 2X and 2Y are the deflection coils for scanning the above electron beam 1 onto the specimen. The secondary electron beam 14 generated from the specimen 4 is detected by the detector 5 and sent to the focused position detector 10 via the amplifier 6. The focused position detector 10 shown in FIG. 1 comprises the focus controller 7 which changes the exciting current of the objective lens sequentially and gradually, the signal intensity integrator 8, and the peak detector 9 which determines the peak of the integrated values. Of course, a picture processing apparatus shown in FIG. 2 may be included.

The focusing apparatus in this embodiment is basically an aforementioned conventional focused position detector 10, to which is added a focus correction value register 12 in which an operator 13 registers a predetermined value corresponding to the data in the wafer information file, and a focus correction value setting device 11 which outputs the registered correction value to the focused position detector are added.

Figure 3:
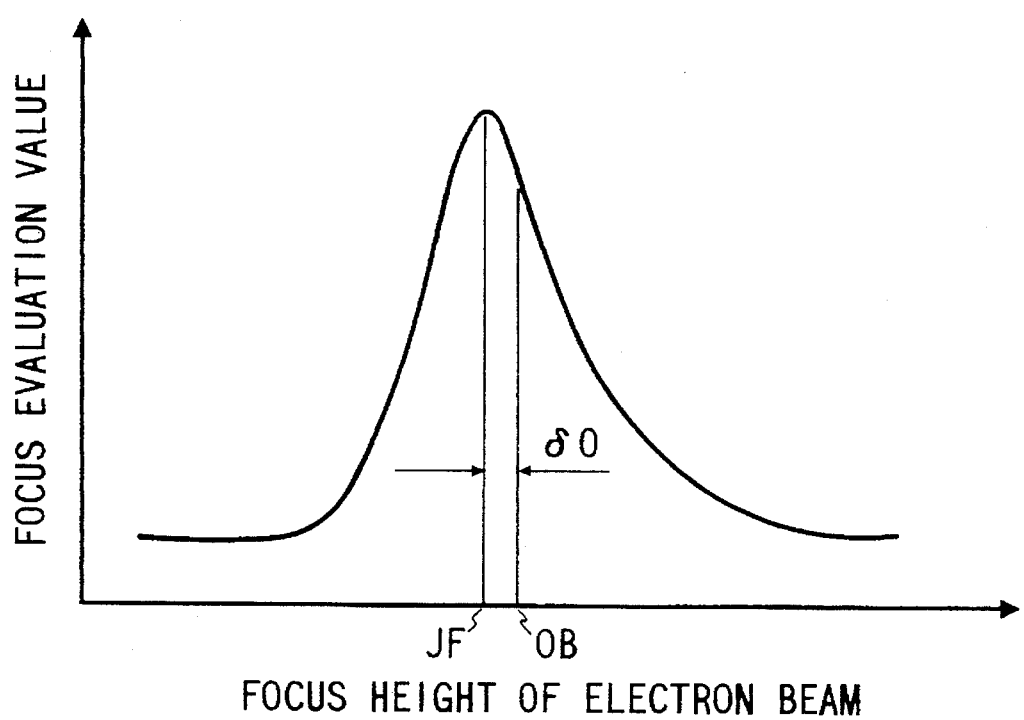
FIG. 3 is a graph showing the relationship between the focused position of an electron beam and the focus evaluation value.

FIG. 3 shows the relationship between the focused position by the electron beam and the focus evaluation value determined by the focused position detector 10. In this figure the focus evaluation value reaches its peak when the focused position is at point JF, so focusing the electron beam onto this point will result in a well focused picture.

However, if auto focusing operation is carried out on a specimen like a semiconductor in-process wafer 43 as shown in FIG. 4, on which resist 41 is applied and a hole 42 is formed at an optional point, or onto a bottom of a line pattern, the focus may not be determined at a required height.

Figure 4A:
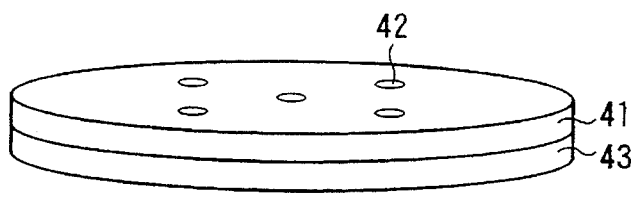
FIG. 4(a) is a perspective view of an example specimen to be observed using an auto focusing mechanism.
Figure 4B:
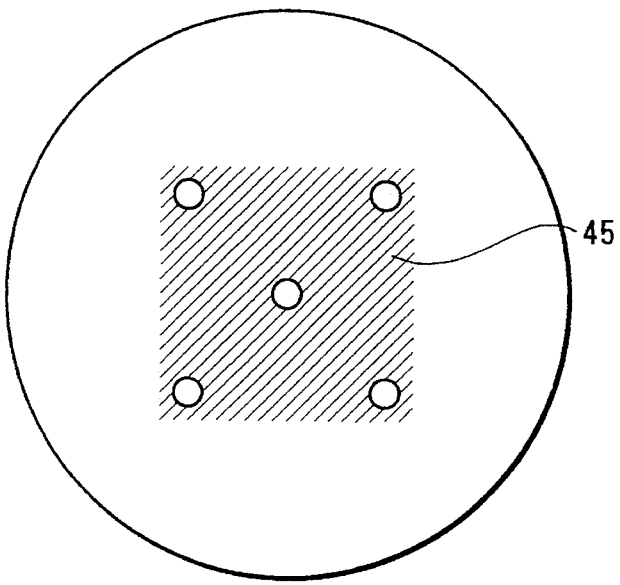
FIG. 4(b) is a top plane view of the example specimen shown in FIG. 4(a).
Figure 4C:
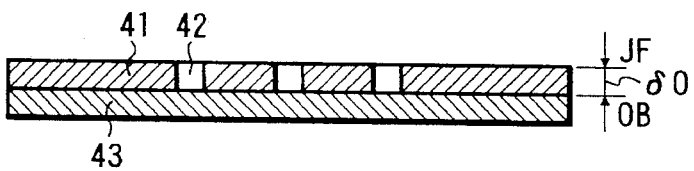
FIG. 4(c) is a sectional view of the example specimen shown in FIG. 4(b).

FIG. 4 shows a brief diagram of a hole pattern made in the resist on a silicon wafer: FIG.4(a) is a diagonal view, FIG. 4(b) is a plan view, and FIG. 4(c) is a sectional view. Hatched area in FIG. 4(b) is an area which is irradiated by the electron beam during the auto focusing operation, while each hatched area in FIGS. 4(a) and 4(c) shows the resist.

Because the change in the secondary electron signal intensity, which is obtained as the focus is changed and as an electron beam is irradiated onto the hatched area 45 in FIG. 4(b), greatly depends on the edge of a pattern, the detected signal intensity changes most greatly when the focus is directed onto the height JF. As a result, the focus evaluation value reaches a peak at the height JF and consequently the beam happens to be focused on the point JF. If the required observation point is at the bottom of the hole 42, or at the point OB, the operation results in incorrect focusing.

In this embodiment, it is possible to direct the focus to the point OB and carry out a required focusing operation to the operator's intention by correcting the focus by as much as predetermined correction value $\delta_0$ using the focus correction value register 12 and the focus correction value setting device 11. If wafers of the same design contain multiple patterns which require different observation points, the value $\delta_0$ may not always be the same. The value $\delta_0$ is different in the wafers of different production processes or types. To cope with this problem, the value $\delta_0$ is registered in the focus correction value register in combination with the data in the wafer information file which contains, for example, data on the type of and production process of wafers and on coordinates of each measuring point. When a piece of data for a specific type of the wafer is loaded from the wafer information file, a corresponding registered data item is also loaded from the focus correction value register so that an applicable $\delta_0$ may be set automatically by the apparatus for any point in the coordinates selected for observation and measurement.

Figure 5:
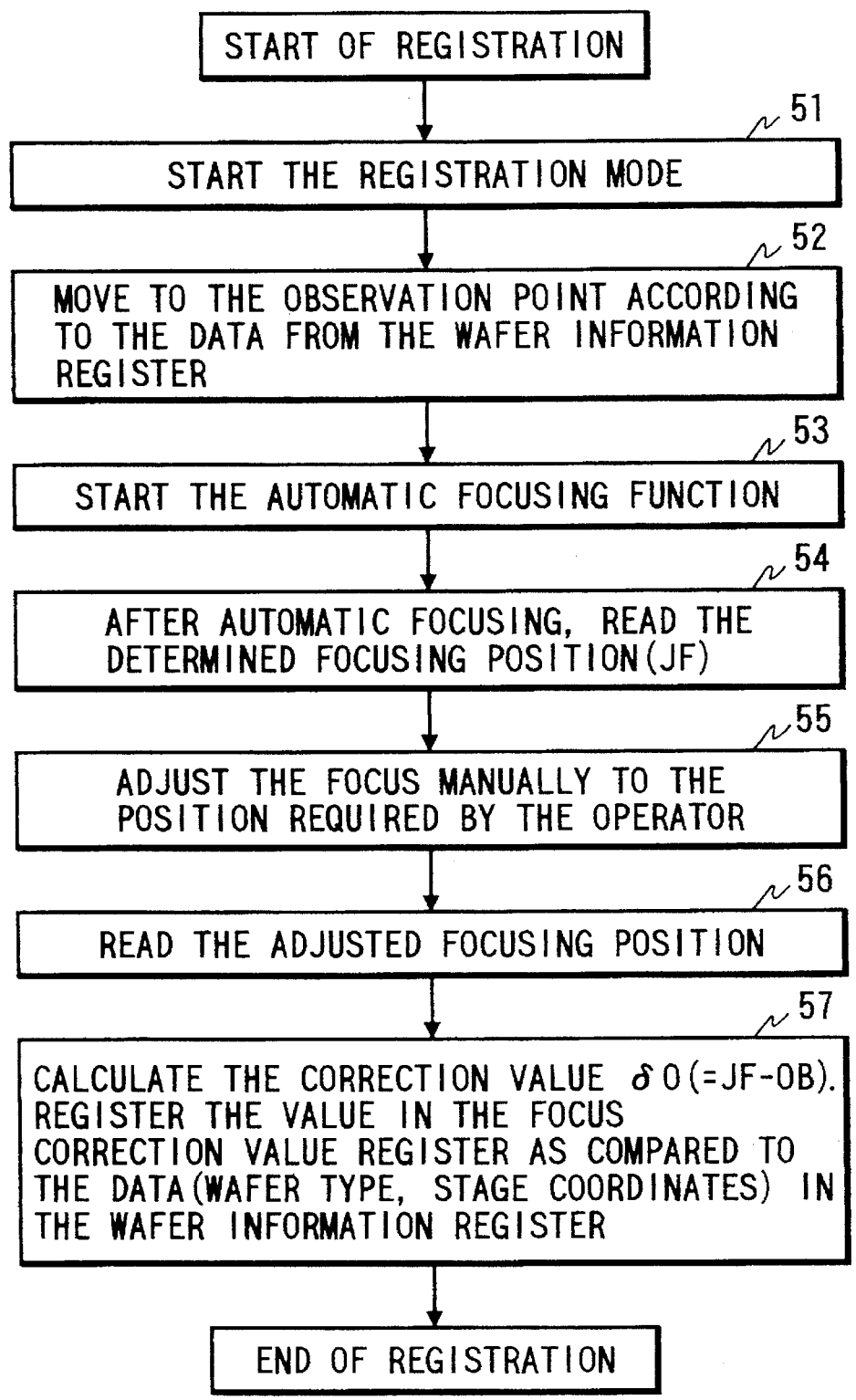
FIG. 5 is a flowchart of procedure for registering a correction value.
Figure 6:
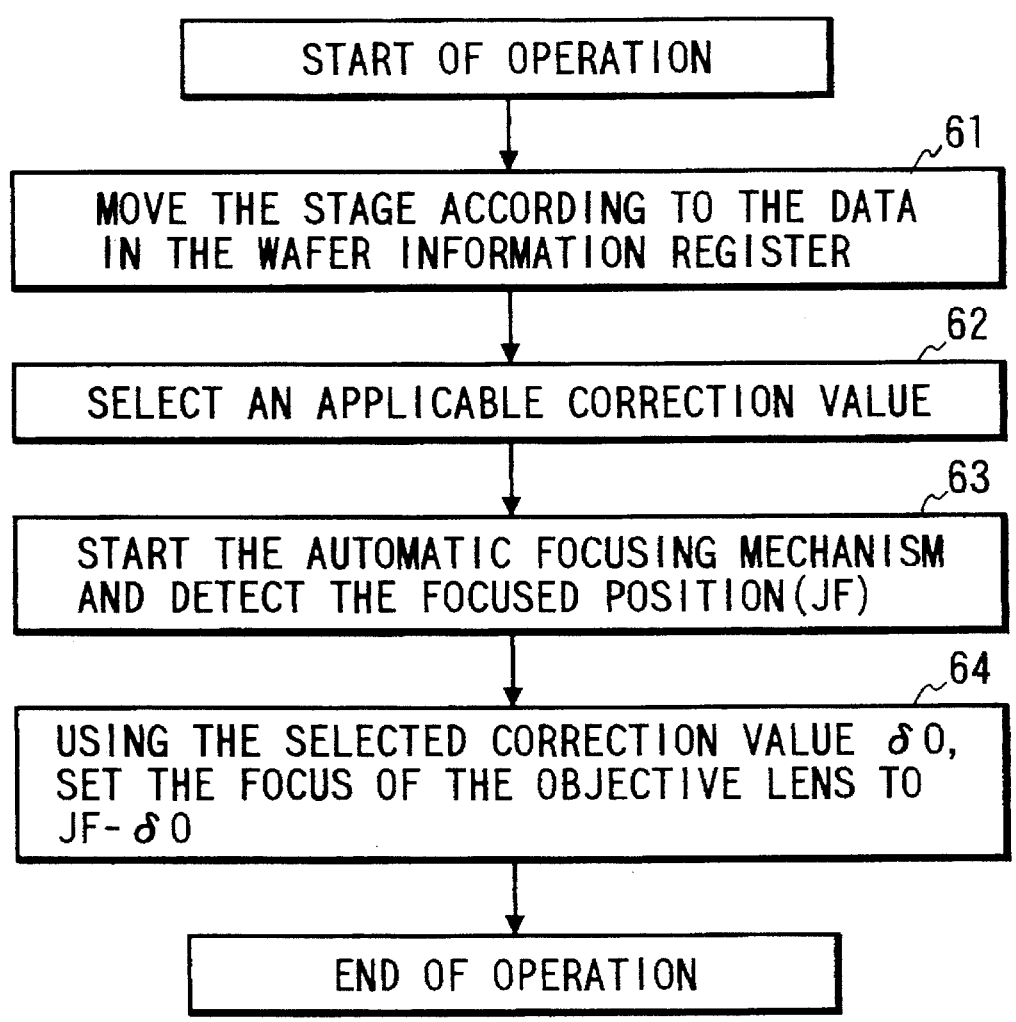
FIG. 6 is a flowchart of procedure for adjusting the focus according to this invention.

FIGS. 5 and 6 show an example procedure for the auto focusing operation including correction of the focused position by means of this invention.

FIG. 5 shows a procedure for registering a focus correction value in the focus correction value register 12. To register a focus correction value, start the registration mode (Step 51) and move the stage according to the data in the wafer information register so that the observation point is positioned at the center of the screen (Step 52).

Then, conduct the auto focusing operation using a conventional focused position detector (Step 53) and read the focused position determined by the auto focusing operation. It is assumed that the focus is determined on point JF. This focused position is read automatically by the apparatus. Next, the operator adjusts the focused position manually to a required position such as at point OB (Step 55). The apparatus reads the adjusted focused position OB in the same manner as in Step 54 (Step 56). Lastly at Step 57, the correction value $\delta_o$ (=JF–OB) is calculated and the result is registered. Here, the registration procedure is complete. When it is necessary to register multiple focus correction values for different observation points, repeat Steps 52 to 57 as many times as required. The focus correction value and the corresponding position data registered by the focus correction value register 12 are set in the focused position detector 10 by the focus correction value setting device 11.

The auto focusing operation by means of this invention is carried out as shown in FIG. 6. Drive the stage and move the specimen according to the data in the wafer information register (Step 61), and, according to the type or production process of the wafers, select an applicable correction value which corresponds to the coordinates of the stage, using the focus correction value register (Step 62). Then, start a conventional auto focusing mechanism and detect the focused position (Step 63). Here, it is assumed that the focused position is at point JF. Next, calculate "JF–$\delta_0$" using the registered correction value $\delta_0$, correct the exciting current of the objective lens 3 and move the focused position by $\delta_0$, and set the focus at the position OB (Step 64). Now, the focusing operation is complete.

When the focused position is read, the correction value is registered or the focused position is corrected in Steps 54, 56, 57, 63, and 64, automatically in terms of the exciting current through the objective lens 3, and not in terms of the actual distance.

Although correction in the aforementioned embodiments are based on a focused position detector which uses the electron signal generated from the specimen, a focused position detector which detects the focused position through picture processing of the observed image may also be included.

In a production control process a large amount of specimens are to be observed at multiple points of similar patterns, such as in the visual inspection in a semiconductor wafer production process, and when the focused point determined by an auto focusing mechanism differs from a point at which the actual focus needs to be directed for observation, this invention makes it possible to automatically set the focused position onto a desired point without correcting the position each time by manual operation, thereby improving the operation efficiency drastically.

What is claimed is:

1. An auto focusing apparatus of a scanning electron microscope comprising:

an auto focusing mechanism;

an objective lens;

a focus correction value register; and a focus correction mechanism;

wherein said auto focusing mechanism calculates a focus evaluation value, using an electron signal generated from a specimen when the specimen is scanned by an electron beam focused by said objective lens, and controls an exciting current of the objective lens according to said focus evaluation value; and said focus correction mechanism corrects a focused position determined by said auto focusing mechanism by as much as a focus correction value registered in the focus correction value register.

2. The auto focusing apparatus of a scanning electron microscope of claim 1, wherein said focus correction mechanism corrects the exciting current of the objective lens.

3. The auto focusing apparatus of a scanning electron microscope of claim 1, wherein multiple correction values in combination with the position information of an observation point can be registered in the focus correction value register.

4. The auto focusing apparatus of a scanning electron microscope of claim 1, wherein multiple correction values can be registered in the focus correction value register according to type or production process of the specimen, and can be set selectively according to the specimen to be observed.

5. An auto focusing apparatus of a scanning electron microscope comprising:

an auto focusing mechanism;

an objective lens;

a focus correction value register; and a focus correction mechanism;

wherein said auto focusing mechanism calculates a focus evaluation value, using a picture signal generated from a specimen when the specimen is scanned by an electron beam focused by said objective lens, and controls an exciting current of the objective lens, according to said focus evaluation value; and wherein said focus correction mechanism corrects a focused position determined by said auto focusing mechanism by as much as a focus correction value registered in the locus correction value register.

6. The auto focusing apparatus of a scanning electron microscope of claim 5, wherein said focus correction mechanism corrects the exciting current of the objective lens.

7. The auto focusing apparatus of a scanning electron microscope of claim 5, wherein multiple correction values in combination with the position information of an observation point can be registered in the focus correction value register.

8. The auto focusing apparatus of a scanning electron microscope of claim 5, wherein multiple correction values can be registered in the focus correction value register according to type or production process of the specimen, and can be set selectively according to the specimen to be observed.

* * * * *